US007969204B1

(12) United States Patent
Huang (10) Patent No.: US 7,969,204 B1
(45) Date of Patent: Jun. 28, 2011

(54) SAMPLE HOLD CIRCUIT AND METHOD THEREOF FOR ELIMINATING OFFSET VOLTAGE OF ANALOG SIGNAL

(75) Inventor: Chih-Haur Huang, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 0 days.

(21) Appl. No.: 12/642,875

(22) Filed: Dec. 21, 2009

(51) Int. Cl.
*G11C 27/02* (2006.01)

(52) U.S. Cl. ............ 327/94; 327/93; 327/307; 327/337; 327/554

(58) Field of Classification Search ............... 327/91–96, 327/307, 337, 554
See application file for complete search history.

(56) References Cited

U.S. PATENT DOCUMENTS

| | | | | |
|---|---|---|---|---|
| 4,707,624 A * | 11/1987 | Yee | ................................. | 327/362 |
| 6,147,551 A * | 11/2000 | Hong | ............................. | 327/554 |
| 6,351,506 B1 * | 2/2002 | Lewicki | ......................... | 375/350 |
| 6,529,237 B1 * | 3/2003 | Tsay et al. | ..................... | 348/241 |
| 7,348,838 B2 * | 3/2008 | Ranganathan et al. | ........ | 329/320 |
| 2011/0043286 A1 * | 2/2011 | Youngblood | .................. | 330/295 |

* cited by examiner

*Primary Examiner* — Lincoln Donovan
*Assistant Examiner* — William Hernandez
(74) *Attorney, Agent, or Firm* — Jianq Chyun IP Office (57) ABSTRACT

A sample hold circuit and a method for eliminating the offset voltage of the analog signal are provided. The sample hold circuit includes a sample unit, a plurality of capacitors, a control unit and a hold unit. When the sample hold circuit is in a first state, the sample unit samples an analog signal. When the sample hold circuit is in a second state, the capacitors eliminate a DC offset voltage of the analog signal sampled by the sample unit, and the hold unit outputs an AC signal of the analog signal sampled by the sample unit. The control unit adjusts a number of the capacitances coupled to a common voltage according to a magnitude of the DC offset voltage, thus to determine the capacitance for eliminating the DC offset voltage.

8 Claims, 6 Drawing Sheets

Parity bit

SAMPLE HOLD CIRCUIT AND METHOD THEREOF FOR ELIMINATING OFFSET VOLTAGE OF ANALOG SIGNAL

BACKGROUND OF THE INVENTION

1. Field of the Invention

The present invention relates to a sample hold circuit and an eliminating method thereof. More particularly, the present invention relates to a sample hold circuit and a method thereof for eliminating an offset voltage of an analog signal.

2. Description of Related Art

Most of physical signals generated in daily life are analog signals. However, since a digital signal is easy to be edited, analyzed, stored and has a better anti-noise capability, in an actual application, the analog signal is generally converted into the digital signal through an analog-to-digital converter (ADC).

The ADC plays an important role in wireless communication systems and portable video image devices, and as the wireless communication systems and the portable video image devices are quickly developed, demand for a high conversion speed of the ADC is increased. In various types of ADC structures, a pipelined ADC can achieve features of high-speed input and fast processing.

In a general ADC, a sample hold circuit is generally disposed at a front end thereof, which is used for holding the analog signal. Since a sampling time is very short, a sampling output is a series of discontinuous narrow pulses, so that certain time is required to digitalize each of the sampled narrow pulse signals. Therefore, between two samplings, the sampled analog signal is temporarily stored until a next sampling pulse is received, and such operation is referred to as "hold". According to a basic principle of digital signal processing (i.e. the Nyquist sampling theorem), if the extracted analog signal is required to be accurately and truly rendered, a sampling frequency has to be higher than twice of a maximum frequency. Therefore, the conversion speed of the ADC is usually determined by an operation frequency of the sample hold circuit. As a signal processing speed of the ADC becomes higher, demand for the operation frequency of the corresponding sample hold circuit is accordingly increased. Therefore, to improve the operation frequency of the sample hold circuit to cope with an actual demand is an important subject.

Figure 1:
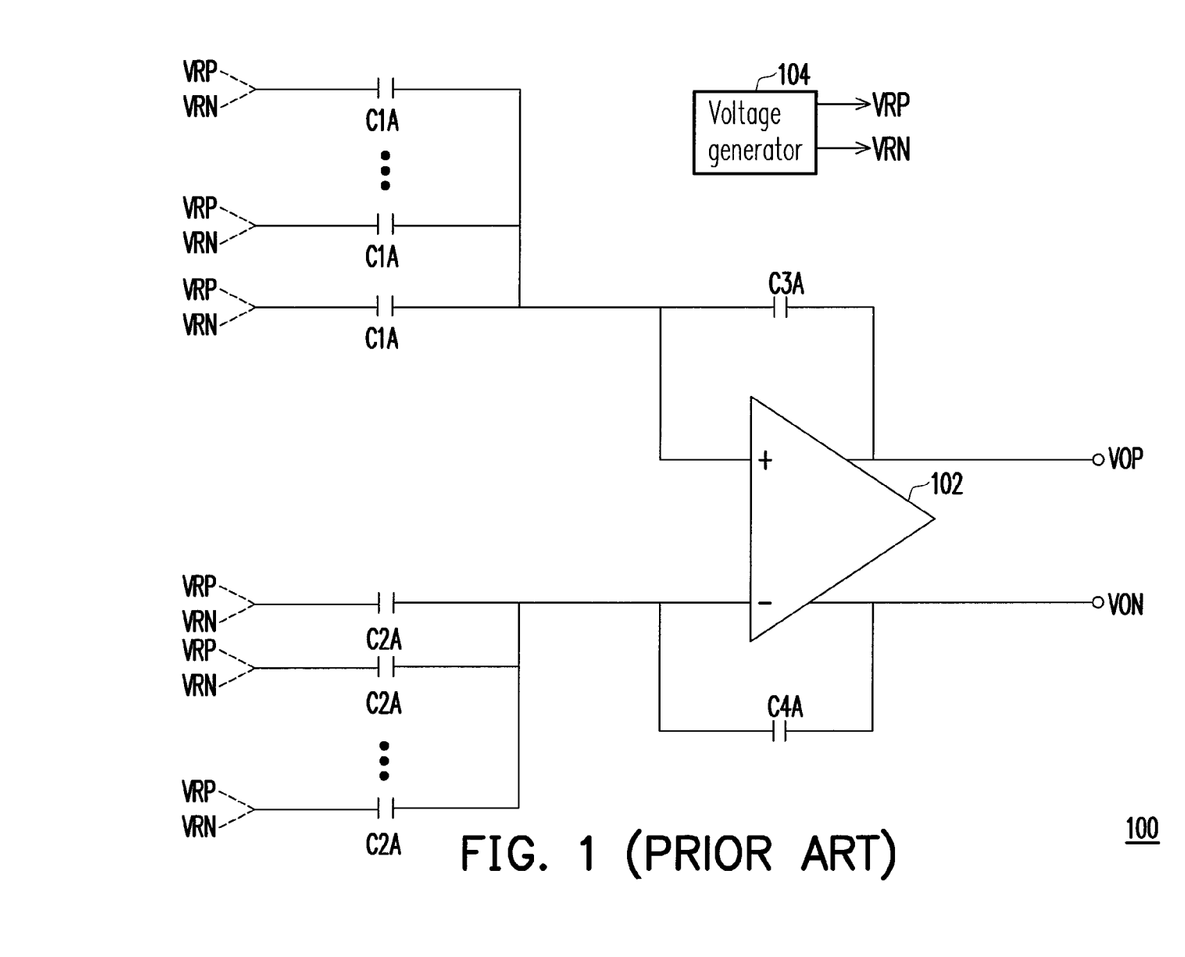
FIG. 1 is an equivalent circuit diagram illustrating a conventional sample hold circuit in a hold state.
Figure 2:
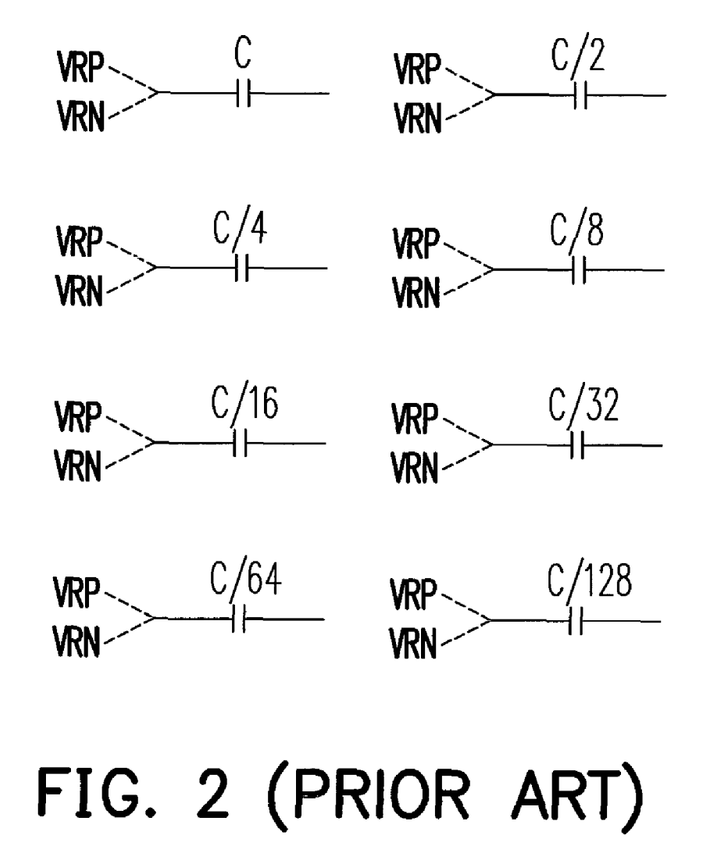
FIG. 2 is a schematic diagram illustrating a plurality of capacitors C1A of FIG. 1 coupled to different voltages.

FIG. 1 is an equivalent circuit diagram illustrating a conventional sample hold circuit in a hold state. FIG. 2 is a schematic diagram illustrating a plurality of capacitors C1A of FIG. 1 coupled to different voltages. Referring to FIG. 1 and FIG. 2, the conventional sample hold circuit 100 includes capacitors C3A, C4A, a plurality of capacitors C1A, a plurality of capacitors C2A, an operation amplifier 102 and a voltage generator 104. The voltage generator 104 is used for outputting reference voltages VRP and VRN. The embodiment of FIG. 2 has 8 capacitors C1A with different capacitances. The capacitances of the capacitors C1A are respectively C, C/2, C/4, C/8, C/16, C/32, C/64, and C/128. When the sample hold circuit 100 is in the hold state, the capacitors C1A and C2A are connected to the reference voltage VRP and/or the reference voltage VRN, so that the sample hold circuit 100 can eliminate a positive or a negative offset voltage of the sampled analog signal. Wherein, the reference voltage VRP is equal to a negative reference voltage VRN, i.e. VRP=−VRN. Moreover, a coupling approach of the capacitors C2A is the same to that of the capacitors C1A, so that detail description thereof is not repeated. Though the conventional sample hold circuit 100 can eliminate the positive or negative offset voltage of the sampled analog signal, in an actual application, a magnitude of the offset voltage can be different due to different environmental factors or a noise of the analog signal. The conventional sample hold circuit still uses the fixed number of the capacitors to eliminate the offset voltage even when the magnitude of the offset voltage of the analog signal is relatively small, and each of the capacitors is either coupled to the reference voltage or coupled to the reference voltage VRN, so that a large current is extracted from the voltage generator 104, and therefore the reference voltages are pulled down for a large potential. Therefore, a relatively longer time is taken for the reference voltage recovering back to its original potential, so that the operation speed of the sample hold circuit is limited, and accordingly a conversion efficiency of the ADC is reduced.

SUMMARY OF THE INVENTION

Accordingly, the present invention is directed to a sample hold circuit and an eliminating method thereof, which can eliminate a direct current (DC) offset voltage of an analog signal, and increase an operation speed of an analog-to-digital (ADC) converter.

The present invention provides a sample hold circuit including a sample unit, a plurality of capacitors, a control module and a hold unit. When the sample hold circuit is in a first state, the sample unit samples an analog signal. The capacitors are coupled to the sample unit, and are used for eliminating a DC offset voltage of the analog signal when the sample hold circuit is in a second state. The control module is coupled to the capacitors, and adjusts a number of the capacitors coupled to a common voltage according to a magnitude of the DC offset voltage, so as to determine a capacitance for eliminating the DC offset voltage. Moreover, the hold unit is coupled to the sample unit, and outputs an alternating current (AC) signal of the analog signal when the sample hold circuit is in the second state.

In an embodiment of the present invention, the analog signal includes a waveform signal and a ground signal.

In an embodiment of the present invention, the sample unit includes a first switch, a second switch, a third switch, a fourth switch, a fifth switch, a first capacitor and a second capacitor. Wherein, the first switch and the second switch respectively receive the waveform signal and the ground signal. A first end of the first capacitor is coupled to the first switch, and a first end of the second capacitor is coupled to the second switch. The third switch is coupled between a second end of the first capacitor and a second end of the second capacitor. The fourth switch is coupled to the first capacitor in parallel. The fifth switch is coupled to the second capacitor in parallel. The first switch, the second switch and the third switch are controlled by a first signal to be turned on in the first state and to be turned off in the second state. Moreover, the fourth switch and the fifth switch are controlled by a second signal to be turned off in the first state and to be turned on in the second state.

In an embodiment of the present invention, the hold unit includes an operation amplifier, a third capacitor and a fourth capacitor. A positive input terminal and a negative input terminal of the operation amplifier are respectively coupled to the second end of the first capacitor and the second end of the second capacitor for receiving the analog signal sampled by the sample unit, and a first output terminal and a second output terminal of the operation amplifier output the AC signal of the analog signal. The third capacitor is coupled between the positive input terminal and the first output terminal of the operation amplifier. The fourth capacitor is coupled between the negative input terminal and the second output terminal of the operation amplifier.

In an embodiment of the present invention, a potential of the first signal and a potential of the second signal are not high potentials at the same time.

In an embodiment of the present invention, the waveform signal is a sinusoidal signal.

In an embodiment of the present invention, the control module further includes a control unit and a plurality of multiplexers. The multiplexers are coupled to the control unit, and output terminals of the multiplexers are coupled to the corresponding capacitors. Each of the multiplexers receives a first reference voltage, a second reference voltage and the common voltage, and is controlled by the control unit to output one of the first reference voltage, the second reference voltage and the common voltage through the output terminal.

In an embodiment of the present invention, the capacitors are grouped into a plurality of fifth capacitors and a plurality of sixth capacitors. A first end of each of the fifth capacitors is coupled to the positive input terminal of the operation amplifier, and the capacitances of the fifth capacitors are different from each other. A first end of each of the sixth capacitors is coupled to the negative input terminal of the operation amplifier, and the capacitances of the sixth capacitors are different from each other.

The present invention provides a method for eliminating an offset voltage, which includes following steps. First, when a sample hold circuit is in a first state, a sample unit samples an analog signal. Next, a plurality of capacitors is provided to eliminate a DC offset voltage of the analog signal. Next, a control unit adjusts a number of the capacitors coupled to a common voltage according to a magnitude of the DC offset voltage, so as to determine a capacitance for eliminating the DC offset voltage. Finally, a hold unit outputs an AC signal of the analog signal when the sample hold circuit is in a second state.

According to the above descriptions, the number of the capacitors for eliminating the offset voltage can be adjusted according to a magnitude of the offset voltage of the analog signal, so as to eliminate the DC offset voltage of the analog signal, and increase the operation speed of the ADC.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention discloses a sample hold circuit, which can adjusts a number of capacitors for eliminating an offset voltage according to a magnitude of the offset voltage of the analog signal, so as to reduce a time for a reference voltage used for eliminating the offset voltage recovering back to its original potential, and accordingly increase an operation efficiency of the analog signal. Wherein, the offset voltage in the sampled signal can be eliminated, so that an analog-to-digital converter (ADC) associated with the sample hold circuit can generate a correct digital signal.

Reference will now be made in detail to the present embodiments of the present invention, examples of which are illustrated in the accompanying drawings, wherein like reference numerals refer to the like elements throughout.

Figure 3:
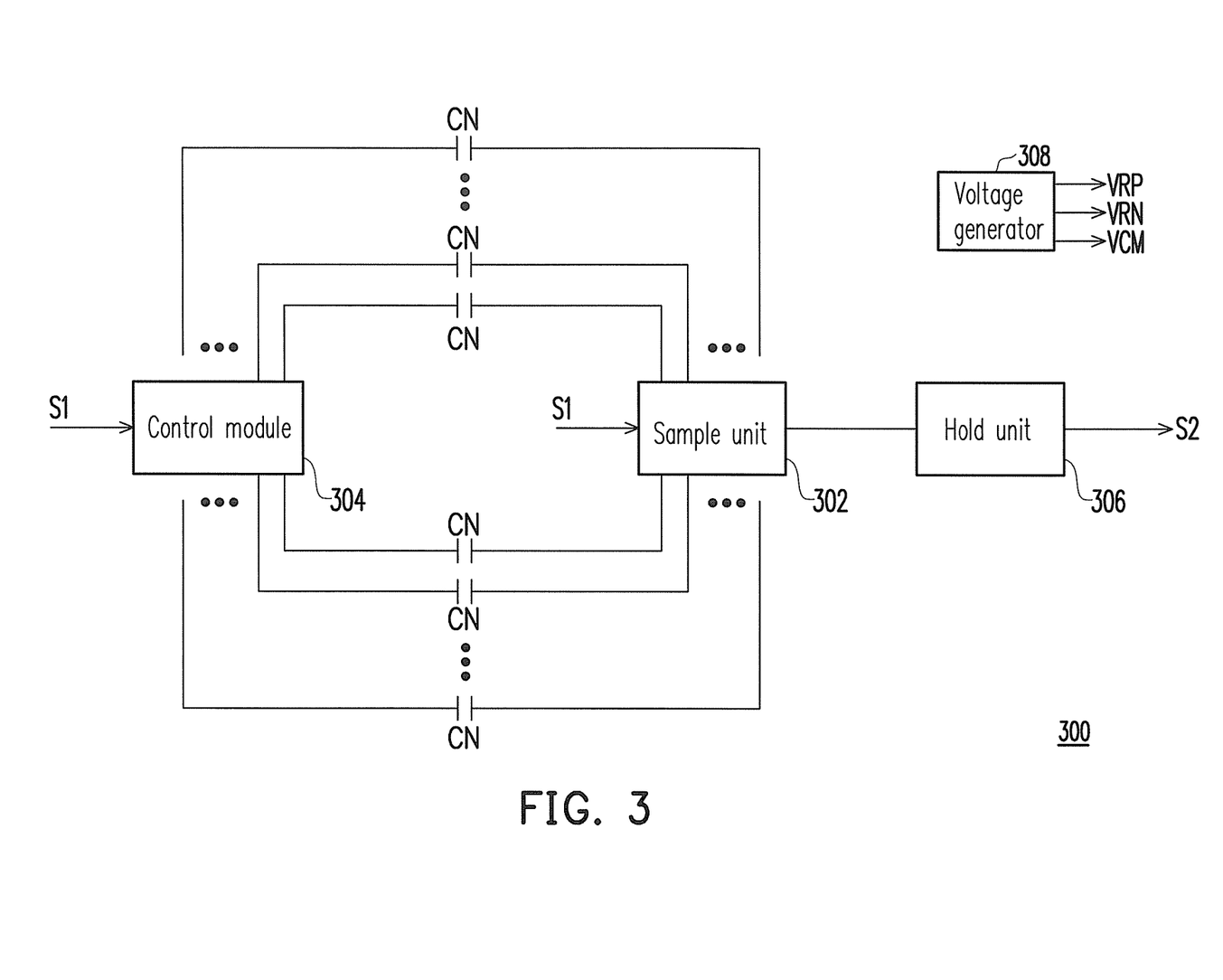
FIG. 3 is a schematic diagram illustrating a sample hold circuit according to an embodiment of the present invention.

FIG. 3 is a schematic diagram illustrating a sample hold circuit according to an embodiment of the present invention. Referring to FIG. 3, the sample hold circuit 300 includes a sample unit 302, a plurality of capacitors CN, a control module 304, a hold unit 306, and a voltage generator 308. The sample unit 302 is used to sample an analog signal S1. The capacitors CN are used to eliminate a DC offset voltage of the analog signal S1 sampled by the sample unit 302. The control module 304 adjusts a number of the capacitors CN used to eliminate the DC offset voltage of the analog signal S1. The hold unit 306 stores and outputs an alternating current (AC) signal S2 of the analog signal S1. The voltage generator 308 provides a reference voltage VRP, a reference voltage VRN, and a common voltage VCM required for eliminating the DC offset voltage. Wherein, the DC offset voltage of the sampled signal can be a positive offset voltage or a negative offset voltage. For example, if the analog signal S1 is a sinusoidal signal while a peak value, a trough value and a central level thereof are originally 1V, 0.5V and 0V, and during a signal transmission process, a positive bias or a negative bias is probably generated, so that the peak value, the trough value and the central level are respectively increased or decreased for a potential value.

Figure 4:
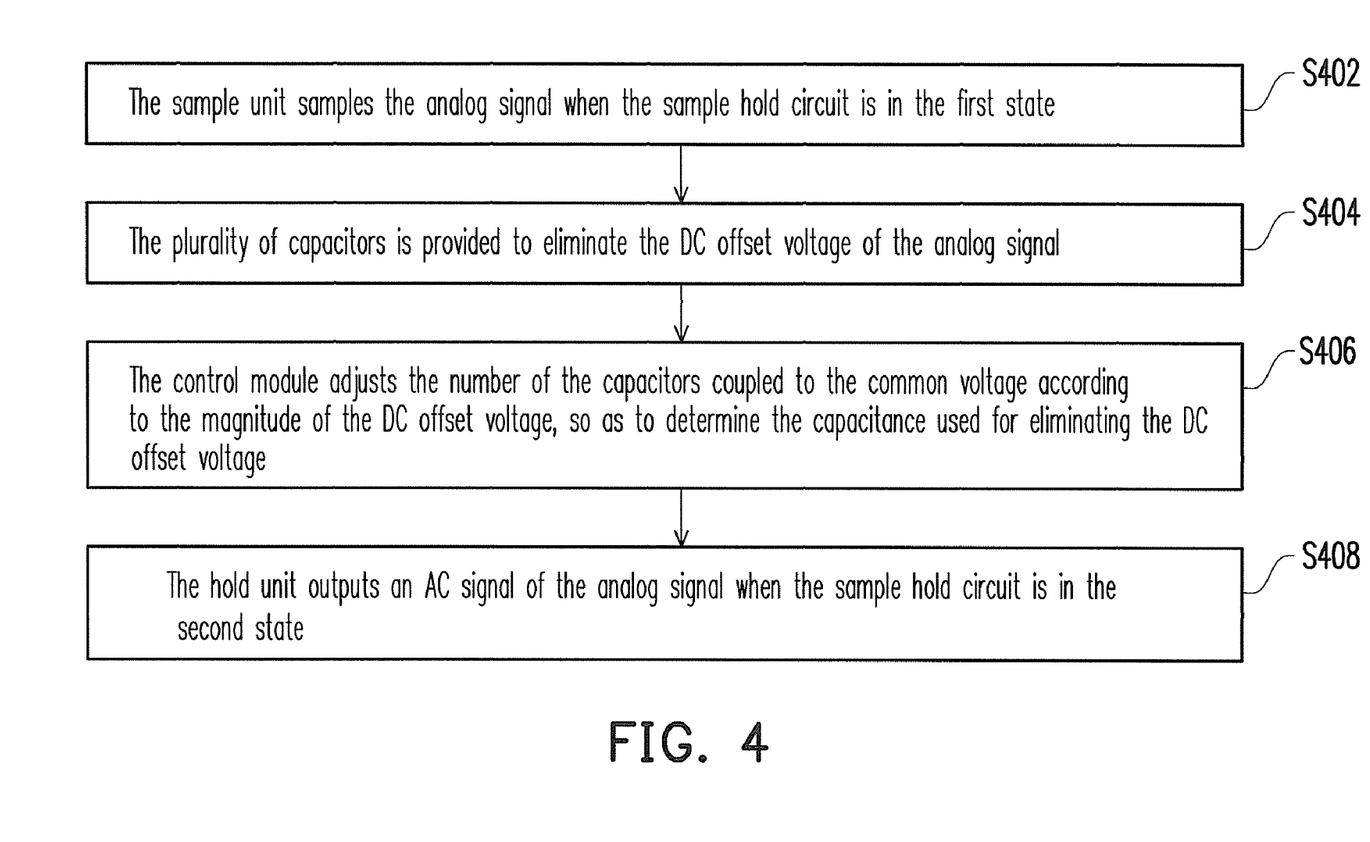
FIG. 4 is a flowchart illustrating a method for eliminating an offset voltage according to an embodiment of the present invention.

FIG. 4 is a flowchart illustrating a method for eliminating an offset voltage according to an embodiment of the present invention. A signal sampling and holding method is described below with reference of FIG. 3 and FIG. 4. Referring to FIG. 3 and FIG. 4, first, when the sample hold circuit 300 is in a sample state, the sample unit 302 samples the analog signal S1 (step S402). Next, the capacitors CN eliminate the DC offset voltage of the analog signal S1 (step S404). Next, when the sample hold circuit 300 is in a hold state, the control module 304 adjusts a number of the capacitors CN coupled to the common voltage VCM according to a magnitude of the DC offset voltage of the analog signal S1, so as to determine a capacitance for eliminating the DC offset voltage of the analog signal S1 (step S406). Wherein, the capacitors CN coupled to the common voltage VCM do not participate an operation of eliminating the DC offset voltage, so that a burden of the voltage generator 308 is reduced. When the number of the capacitors connected to the voltage generator 308 is reduced, a current extracted from the voltage generator 308 is accordingly reduced, so that time for each of the reference voltages VRP and VRN recovering back to its original potential is shortened. Therefore, the voltage generator 308 can provide the corresponding reference voltage VRP or VRN according to the magnitude of the DC offset voltage, which is different to a conventional technique that a large current is continuously extracted from the voltage generator of the sample hold circuit, which leads to a fact that the time for each of the reference voltages VRP and VRN recovering back to its original potential is prolonged, so that an operation frequency of the sample hold circuit is limited. Finally, the hold unit 306 outputs an analog signal obtained after the DC offset voltage of the analog signal S1 is eliminated, i.e. the hold circuit 306 outputs the AC signal S2 of the analog signal S1 (step S408). By adjusting the number of the capacitors CN coupled to the common voltage VCM, charging charges provided to the capacitors CN by the voltage generator 308 are reduced, so that a pulled-down potential of each of the reference voltages VRP and VRN is reduced, and accordingly the time for each of the reference voltages VRP and VRN recovering back to its original potential is reduced. Therefore, the sample hold circuit 300 can perform a next sampling and holding operation in advance, so that the conversion efficiency of the analog signal S1 is improved.

Figure 5:
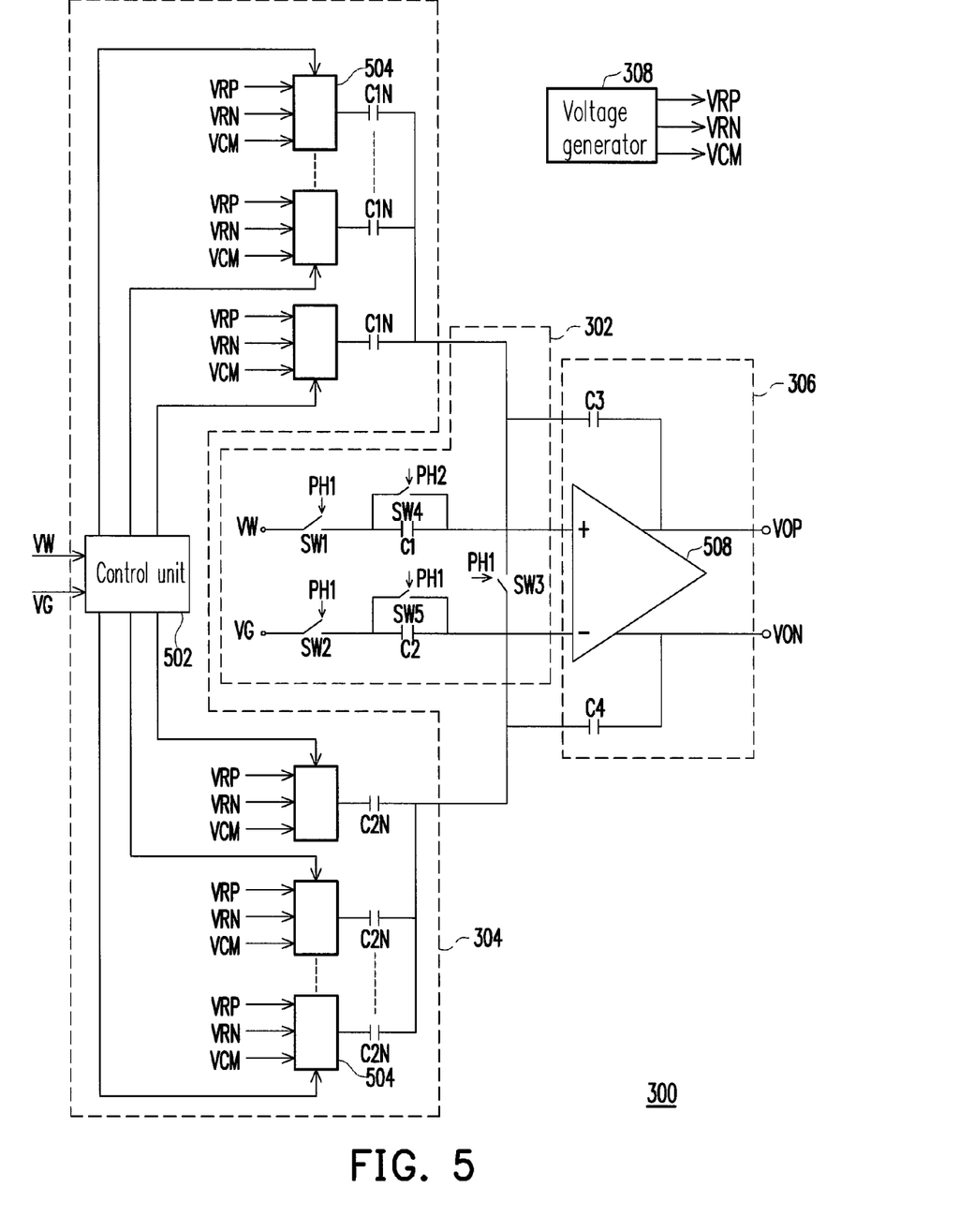
FIG. 5 is a schematic diagram illustrating a sample hold circuit according to another embodiment of the present invention.

FIG. 5 is a schematic diagram illustrating a sample hold circuit according to another embodiment of the present invention. Referring to FIG. 5, in detail, the analog signal S1 includes a waveform signal VW and a ground signal VG, and the sample unit 302 includes switches SW1-SW5 and capacitors C1 and C2. The switches SW1 and SW2 respectively receive the waveform signal VW (e.g. a sinusoidal signal) and the ground signal VG, and are respectively coupled to first ends of the capacitors C1 and C2. The switch SW3 is coupled between second ends of the capacitors C1 and C2. The switches SW4 and SW5 are respectively coupled to the capacitors C1 and C2 in parallel.

The switches SW1-SW3 are controlled by a first signal PH1 to be turned on when the sample hold circuit 300 is in the sample state and to be turned off when the sample hold circuit 300 is in the hold state. Moreover, the switches SW4 and SW5 are controlled by a second signal PH2 to be turned off when the sample hold circuit 300 is in the sample state and to be turned on when the sample hold circuit 300 is in the hold state. Wherein, potentials of the first signal PH1 and the second signal PH2 are not high potentials at the same time.

Moreover, the control module 304 includes a control unit 502 and a plurality of multiplexers 504. The control unit 502 is coupled to the multiplexers 504, and output terminals of the multiplexers 504 are coupled to the corresponding capacitors CN. Each of the multiplexers 504 has three input terminals for respectively receiving the reference voltage VRP, the reference voltage VRN, and the common voltage VCM. Each of the multiplexers 504 is controlled by the control unit 502 to output one of the reference voltage VRP, the reference voltage VRN, and the common voltage VCM. The control unit 502 receives the waveform signal VW and the ground signal VG to determine the outputs of the multiplexers 504.

The hold unit 306 includes an operation amplifier 508 and capacitors C3 and C4. Wherein a positive input terminal and a negative input terminal of the operation amplifier 508 are respectively coupled to the second ends of the capacitors C1 and C2. Moreover, the positive input terminal and the negative input terminal of the operation amplifier 508 are also coupled to the capacitors CN included in the control module 304. The capacitor C3 is coupled between the positive input terminal and an output terminal VOP of the operation amplifier 508, and the capacitor C4 is coupled between the negative input terminal and an output terminal VON of the operation amplifier 508.

When the sample hold circuit 300 is in the sample state, the switches SW1 and SW2 are turned on, and the switches SW4 and SW5 are turned off, so that the capacitors C1 and C2 can receive the waveform signal VW and the ground signal VG through the switches SW1 and SW2. Moreover, the switch SW3 is also turned on, so that the second ends of the capacitors C1 and C2 are short-circuited, and the charges provided by the waveform signal VW and the ground signal VG are stored in the capacitors C1 and C2.

When the sample hold circuit 300 is in the hold state, the switches SW1, SW2 and SW3 are turned off, and the switches SW4 and SW5 connected to the capacitors C1 and C2 in parallel are turned on, so that a short-circuit path is formed between two ends of each of the capacitors C1 and C2. Therefore, the charges stored in the capacitors C1 and C2 during the sample state are transferred, which are redistributed together with the charges stored in the capacitors CN, C3 and C4. Meanwhile, the control unit 502 adjusts the coupling relationship of the capacitors CN and the reference voltages VRN, VRP and the common voltage VCM to a state suitable for eliminating the DC offset voltage according to a magnitude of the DC offset voltage of the waveform signal VW and the ground signal VG. For example, when the positive offset voltage of the analog signal S1 becomes serious, the control unit 502 increases the number of the capacitors CN coupled to the reference voltage VRP, and reduces the number of the capacitors CN coupled to the common voltage VCM. Conversely, when the negative offset voltage of the analog signal S1 becomes serious, the control unit 502 increases the number of the capacitors CN coupled to the reference voltage VRN, and reduces the number of the capacitors CN coupled to the common voltage VCM, so that the sample hold circuit 300 can output the AC signal S2 contained in the analog signal S1 through the output terminals VOP and VON of the operation amplifier 508.

Figure 6:
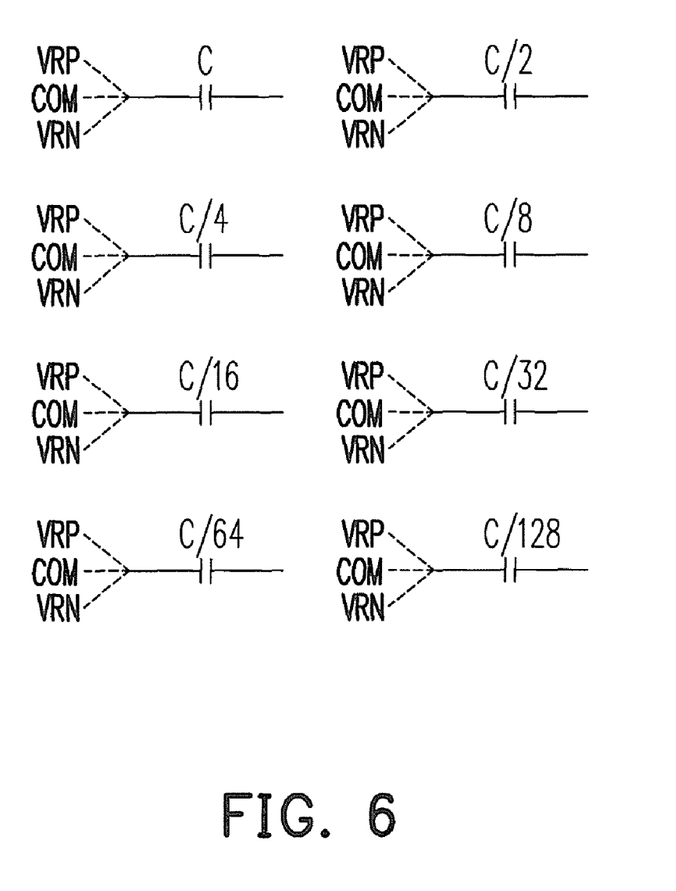
FIG. 6 is a schematic diagram illustrating a plurality of capacitors C1N of FIG. 5 coupled to different voltages.
Figure 7:
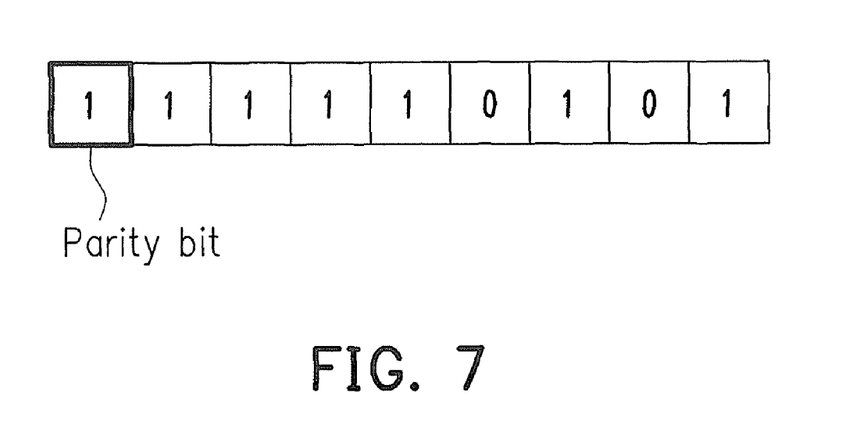
FIG. 7 is a schematic diagram illustrating a control code according to an embodiment of FIG. 6.

In detail, the capacitors CN can be grouped into two groups respectively containing a plurality of capacitors C1N and a plurality of capacitors C2N. Wherein, the capacitors C1N are coupled to the positive input terminal of the operation amplifier 508, and the capacitors C2N are coupled to the negative input terminal of the operation amplifier 508. The capacitances of the capacitors C1N are different from each other, and the capacitances of the capacitors C2N are different from each other. FIG. 6 is a schematic diagram illustrating a plurality of capacitors C1N of FIG. 5 coupled to different voltages. Referring to FIG. 6, in the present embodiment, though 8 capacitors having different capacitances are used to describe the operation states of switching the voltages coupled to the capacitors C1N, the present invention is not limited thereto, and those with ordinary skill in the art can deduce other embodiments with different number of the capacitors according to the present embodiment. In the present embodiment, the capacitances of the capacitors are respectively C, C/2, C/4, C/8, C/16, C/32, C/64 and C/128. Wherein, a coupling state of each of the capacitors and the reference voltages or the common voltage VCM is controlled by the multiplexer 504. The control unit 502 controls the output voltages of the multiplexers 504 according to a control code, so as to determine the coupling states of the capacitors. FIG. 7 is a schematic diagram illustrating the control code according to the embodiment of FIG. 6. Referring to FIG. 7, the control code includes a parity bit and 8 bits, wherein the 8 bits except the parity bit respectively determine the coupling state of each of the capacitors in the embodiment of FIG. 6. For example, when a bit value is 0, the control unit 502 controls the multiplexer 504 to output the reference voltage through the output terminal of the multiplexer 504, so that the capacitor is coupled to the reference voltage, and when a bit value is 1, the capacitor is coupled to the common voltage VCM through the multiplexer 504.

Since the sample hold circuit 300 has two reference voltages of VRP and VRN, the parity bit is used to determine whether the capacitor is coupled to the reference voltage VRP or the reference voltage VRN. For example, when the parity bit is 1, and the bit value for determining the coupling state of the capacitor is 1, the control unit 502 controls the multiplexer 504 to output the reference VRP, so that the capacitor is coupled to the reference voltage VRP. When the bit value for determining the coupling state of the capacitor is 0, the control unit 502 controls the multiplexer 504 to output the common voltage VCM, so that the capacitor is coupled to the common voltage VCM. When the parity bit is 0, and the bit value for determining the coupling state of the capacitor is 1, the capacitor is coupled to the common voltage VCM. When the bit value for determining the coupling state of the capacitor is 0, the capacitor is coupled to the reference voltage VRN. Therefore, 9 bits are required to determine the coupling state of each of the capacitors, and by controlling the coupling states between the capacitors and the reference voltages or the common voltage VCM, the capacitance for eliminating the DC offset voltage is determined.

Moreover, since the capacitances of the capacitors of the present embodiment are different, a user can adjust the coupling state of each of the capacitors according to an actual demand, so that the capacitance coupled to the reference voltage VRP or VRN is not excessively large or small, and accordingly the sample hold circuit 300 can use a minimum number of the capacitors to eliminate the DC offset voltage contained in the analog signal, so as to improve the operation frequency of the sample hold circuit 300.

For example, if the positive offset voltage of the analog signal S1 is very large, the value of the parity bit can be 1, and the bit values for determining the coupling states of the capacitors C1N can be 1, so that the control unit 502 controls all of the multiplexers 504 to output the reference voltage VRP. Accordingly, each of the capacitors C1N is coupled to the reference voltage VRP, so as to eliminate the positive offset voltage of the analog signal S1. If the positive offset voltage of the analog signal S1 is not large, a part of the bit values for determining the coupling states of the capacitors C1N can be 1, and the other bit values are 0, so that a part of the capacitors C1N are coupled to the reference voltage VRP, and the other capacitors C1N are coupled to the common voltage VCM.

Similarly, if the negative offset voltage of the analog signal S1 is very large, the value of the parity bit can be 0, and the bit values for determining the coupling states of the capacitors C1N can be 0, so that each of the capacitors C1N is coupled to the reference voltage VRN, so as to eliminate the negative offset voltage of the analog signal S1. If the negative offset voltage of the analog signal S1 is not large, a part of the bit values for determining the coupling states of the capacitors C1N can be 0, and the other bit values are 1, so that a part of the capacitors C1N are coupled to the reference voltage VRN, and the other capacitors C1N are coupled to the common voltage VCM.

On the other hand, the control method for coupling the capacitors C2N with corresponding voltages is the same to that of the capacitors C1N, and therefore detail description thereof is not repeated.

In summary, the number of the capacitors for eliminating the offset voltage can be adjusted according to the magnitude of the offset voltage of the analog signal, so as to eliminate the DC offset voltage of the analog signal, and increase the operation speed of an analog-to-digital converter (ADC).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A sample hold circuit for analog signals, comprising:
    a sample unit, sampling an analog signal when the sample hold circuit is in a first state;
    a plurality of capacitors, coupled to the sample unit, and eliminating a direct current (DC) offset voltage of the analog signal when the sample hold circuit is in a second state;
    a control module, coupled to the capacitors, and adjusting a number of the capacitors coupled to a common voltage according to a magnitude of the DC offset voltage, so as to determine a capacitance for eliminating the DC offset voltage; and
    a hold unit, coupled to the sample unit, and outputting an alternating current (AC) signal of the analog signal when the sample hold circuit is in the second state;
    wherein the control module comprises:
    a control unit; and
    a plurality of multiplexers, coupled to the control unit, and having output terminals coupled to the corresponding capacitors, wherein each of the multiplexers receives a first reference voltage, a second reference voltage and the common voltage, and is controlled by the control unit to output one of the first reference voltage, the second reference voltage and the common voltage through the output terminal.

2. The sample hold circuit as claimed in claim 1, wherein the analog signal comprises a waveform signal and a ground signal.

3. The sample hold circuit as claimed in claim 2, wherein the sample unit comprises:
    a first switch, receiving the waveform signal;
    a second switch, receiving the ground signal;
    a first capacitor, a first end of the first capacitor being coupled to the first switch;
    a second capacitor, a first end of the second capacitor being coupled to the second switch;
    a third switch, coupled between a second end of the first capacitor and a second end of the second capacitor;
    a fourth switch, coupled to the first capacitor in parallel; and
    a fifth switch, coupled to the second capacitor in parallel,
    wherein the first switch, the second switch and the third switch are controlled by a first signal to be turned on in the first state and to be turned off in the second state,
    and the fourth switch and the fifth switch are controlled by a second signal to be turned off in the first state and to be turned on in the second state.

4. The sample hold circuit as claimed in claim 3, wherein the hold unit comprises:
    an operation amplifier, a positive input terminal and a negative input terminal of the operation amplifier being respectively coupled to the first capacitor and the second capacitor for receiving the analog signal sampled by the sample unit, and a first output terminal and a second output terminal of the operation amplifier being respectively outputting the AC signal of the analog signal;
    a third capacitor, coupled between the positive input terminal and the first output terminal of the operation amplifier; and a fourth capacitor, coupled between the negative input terminal and the second output terminal of the operation amplifier.

5. The sample hold circuit as claimed in claim 3, wherein a potential of the first signal and a potential of the second signal are not high potentials at the same time.

6. The sample hold circuit as claimed in claim 2, wherein the waveform signal is a sinusoidal signal.

7. The sample hold circuit as claimed in claim 1, wherein the capacitors are grouped into:
   a plurality of fifth capacitors, each of which having a first end coupled to the positive input terminal of the operation amplifier, and the capacitances of the fifth capacitors being different from each other; and
   a plurality of sixth capacitors, each of which having a first end coupled to the negative input terminal of the operation amplifier, and the capacitances of the sixth capacitors being different from each other.

8. A method for eliminating an offset voltage of an analog signal, comprising:
   sampling an analog signal by a sample unit when a sample hold circuit is in a first state;
   providing a plurality of capacitors to eliminate a DC offset voltage of the analog signal;
   adjusting a number of the capacitors coupled to a common voltage by a control module according to a magnitude of the DC offset voltage, so as to determine a capacitance for eliminating the DC offset voltage, wherein the control module comprises a control unit and a plurality of multiplexers, and the plurality of multiplexers are coupled to the control unit and have output terminals coupled to the corresponding capacitors;
   outputting an AC signal of the analog signal by a hold unit when the sample hold circuit is in a second state;
   receiving a first reference voltage, a second reference voltage and the common voltage by each of the multiplexers; and
   controlling each of the multiplexers by the control unit to output one of the first reference voltage, the second reference voltage and the common voltage through a corresponding one of the output terminals.

* * * * *